United States Patent [19]
Huang

[11] Patent Number: 5,679,211
[45] Date of Patent: Oct. 21, 1997

[54] SPIN-ON-GLASS ETCHBACK PLANARIZATION PROCESS USING AN OXYGEN PLASMA TO REMOVE AN ETCHBACK POLYMER RESIDUE

[75] Inventor: Yuan-Chang Huang, Hsin-chu, Taiwan

[73] Assignee: Taiwan Semiconductor Manufacturing Company, Ltd., Hsin-chu, Taiwan

[21] Appl. No.: 529,872

[22] Filed: Sep. 18, 1995

[51] Int. Cl.$^6$ ............................................. H01L 21/306
[52] U.S. Cl. ................................ 156/643.1; 156/653.1; 216/38; 437/228; 437/231; 437/238
[58] Field of Search ..................... 156/643.1, 646.1, 156/653.1; 216/67, 38; 437/238, 235, 228, 231

[56] References Cited

U.S. PATENT DOCUMENTS

| | | | |
|---|---|---|---|
| 4,676,867 | 6/1987 | Elkins et al. | 156/643 |
| 4,986,878 | 1/1991 | Malazgirt et al. | 156/643 |
| 5,290,399 | 3/1994 | Reinhardt | 216/38 |
| 5,316,980 | 5/1994 | Takeshiro | 437/228 |
| 5,320,983 | 6/1994 | Ouellet | 437/231 |
| 5,378,318 | 1/1995 | Weling et al. | 156/662 |
| 5,434,107 | 7/1995 | Paranjpe | 437/225 |
| 5,461,010 | 10/1995 | Chen et al. | 437/228 |
| 5,567,658 | 10/1996 | Wang et al. | 437/228 |
| 5,569,618 | 10/1996 | Matsubara | 437/52 |

OTHER PUBLICATIONS

Wolf, "Silicon Processing for the VLSI Era vol. 2: Process Integration", pp. 229–236, (1990).

*Primary Examiner*—R. Bruce Breneman
*Assistant Examiner*—Anita Alanko
*Attorney, Agent, or Firm*—George O. Saile; Stephen B. Ackerman; William J. Stoffel

[57] ABSTRACT

A method for improving the etch back uniformity of a SOG layer by removing an etch back resistant polymer which builds up on the SOG layer during the etch back process. According to the present invention, a first insulation layer and a SOG layer are formed on a substrate. The SOG layer is partially etched back in a fluorocarbon containing plasma which forms a polymer residue on the SOG layer surface. The SOG layer is then treated in situ with an oxygen containing plasma to remove any of the etch resistant polymer residue on the SOG layer surface. The above in situ etch and oxygen containing plasma treatment of the spin-on-glass layer are repeated until the SOG layer is etched back to the desired thickness.

26 Claims, 2 Drawing Sheets

5,679,211

SPIN-ON-GLASS ETCHBACK PLANARIZATION PROCESS USING AN OXYGEN PLASMA TO REMOVE AN ETCHBACK POLYMER RESIDUE

BACKGROUND OF INVENTION

1) Field of the Invention

The present invention relates to a method for manufacturing a semiconductor device, and more particularly to a method for planarizing an insulating interlayer to be used in conjunction with other multilevel interconnect technology. The planarization involves etchback spin-on-glass techniques.

2) Description of the Prior Art

The growing and regrowing of insulating films, such as silicon dioxide, and the use of polysilicon and metals in the form of conductors, ohmic contacts, and resistors in the manufacturer of integrated circuits create irregular or substantially non-planar surfaces across the surface of the semiconductor substrate. A major problem that is caused by these irregular or non-planar surfaces is loss of resolution in the lithographic masking processes. For example, metal conductors formed on insulating films have different widths across the surface of the semiconductor body due to the different resist development because of the resolution problems.

To prevent conductors from having varying widths to the point where they might cause short circuits, extra spacing or tolerance is required between each conductor. The increased tolerances reduce the number of devices that may be formed in the semiconductor structure. This problem increases with each higher level of metallurgy and with the use of submicron lithography features. In these highly dense, submicron integrated circuits three or four levels of interconnect metallurgy are required.

One popular method available for planarizing the semiconductor wafer is to form a first conformal silicon oxide layer over the underlying irregular structures. Next, a planarizing spin-on-glass (SOG) layer is formed over the first silicon oxide layer. The SOG layer is etched back to remove most or all of the SOG layer and possibly a portion of the first oxide layer. This etch back step is used to transfer the planar SOG top surface shape to the first oxide surface. The etch of the SOG layer and the silicon oxide layer is controlled so that they both etch at about the same rate. Next, a second silicon oxide layer can be formed over the remaining SOG layer. The first silicon dioxide or the like layer serves as an adhesion and a hillock suppression layer between the pattern conductors. It also prevents the spin-on-glass material from being in contact with the pattern conductors.

In the case of etch back processing, typically a coating is formed on top of the irregular surfaces by a means of spin on glass or thermoplastic deposition techniques which produce a planar surface. A plasma, reactive, or chemical wet etch is used uniformly across the planar surface to remove the deposited SOG layer and the tops of the irregular humps or the like to produce a planar surface at the desired depth.

However, the current spin-on-glass (SOG) etch back processes do not provide an uniform etch which results in an oxide thickness variation across a wafer and the resulting surface of the first oxide layer is less than planar. The non-uniform etchback is often caused by the faster etch rate of the SOG near the edge of the wafer compared to the center of the wafer. For example, for an etch back of a 6000 Å spin-on-glass layer and a 1500 Å etch back into an underlying silicon oxide layer, the typical resulting silicon oxide layer thickness range (e.g., between the center and periphery) will be between 1500 to 2000 Å. The non-uniform and lower etch back in the wafer center can produce tungsten residue and metal bridging problems. These problems result when the surface is non-planar and metal is left in the valleys in the surface. The metal residue often occurs at the edge of the wafer because the SOG planarization degrades with the increased etch back.

It is desirable to develop a SOG etch back process that improves etch uniformity and improves planarity.

U.S. Pat. No. 4,676,867, to Elkins and U.S. Pat. No. 4,986,878 to Malazgirt, describe SOG etchback processes, but do not adequately improve the SOG etchback uniformity.

SUMMARY OF THE INVENTION

It is an object of the present invention to provide a method of etching back SOG layers that provides improved etch uniformity and improved planarity.

It is another object of the present invention to provide a method of etching back SOG layers that provides improved etch uniformity by overcoming the polymer residue problem.

It is yet another object of the present invention to provide a method of etching back SOG layers that reduces the polymer contamination within the plasma etcher.

According to the present invention, a method for uniformly etching back a SOG layer comprises the following steps. A first insulation layer is formed over a substrate. Second, a SOG layer is formed over the first insulating layer and the SOG layer is cured. Third, the SOG layer is partially etched which also is accompanied by an etch back resistant polymer residue formation on the SOG layer surface. The etch can be performed with a reactive ion etch with a trifluoromethane ($CHF_3$) and carbon tetrafluoride ($CF_4$) chemistry. The polymer residue is formed thicker in the center of the substrate than in the outer periphery by the normal reaction kinetics. Fourth, the etch is stopped. Fifth, the SOG layer is treated with an oxygen containing plasma to remove any polymer layer on the SOG layer surface. The third through fitch steps may be repeated until the SOG layer is etched back to the desired thickness. The Oxygen containing plasma etch can be performed in situ where the Oxygen containing plasma treatment also removes polymer from the plasma tool walls. This reduces the plasma tool cleaning frequency and reduce wafer contamination. The oxygen treatment removes any polymer on the wafer allowing for an uniform SOG etch back which yields a planar semiconductor surface.

DETAILED DESCRIPTION OF THE PREFERRED EMBODIMENTS

The present invention will be described in detail with reference to the accompanying drawings. It should be noted that the drawings are in greatly simplified form.

Figure 1:
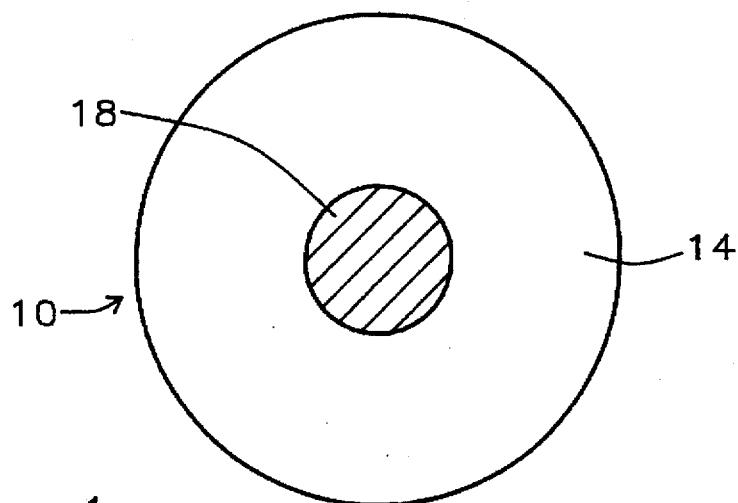
FIG. 1 is a top plan view of a substrate having the polymer coating problem resulting from the etch back of the spin-on-glass layer.
Figure 2:
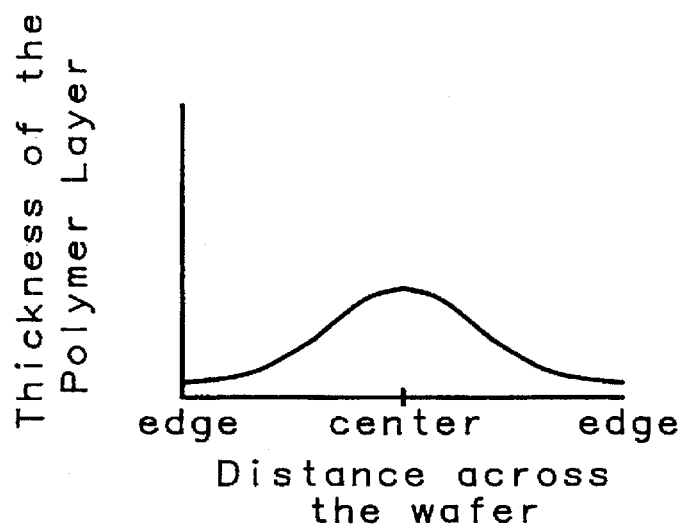
FIG. 2 is a graph showing the polymer thickness across the diameter of a wafer.

During the conventional etch back of a SOG layer using an isotropic etch (e.g., a reactive ion etch using a trifluoromethane and carbon tetrafluoride chemistry), an etch resistant polymer 18 is formed on the wafer as shown in FIG. 1. The polymer build up is thicker in the center of the wafer than on the outside periphery because of normal reaction kinetics as shown in FIG. 2. The polymer inhibits the etch back in the center and allows a faster etch back on the periphery of the wafer.

The in situ etchback and oxygen containing plasma treatment of the present invention solve the problem of non-uniform etch. The wafer is etched until a layer of polymer is formed. The etch is then stopped and an insitu oxygen treatment is applied to the wafer to remove the polymer. Then the etch is continued. These etch/treatment steps can be repeated as many times as necessary to ensure an even etch back.

Figure 3:
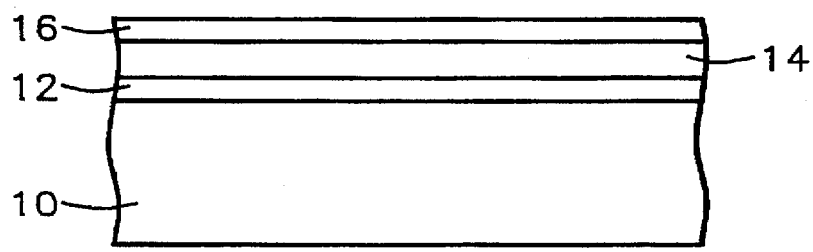
FIG. 3 is a cross sectional view for explaining the process of the present invention for forming and planarizing a SOG layer.
Figure 4:
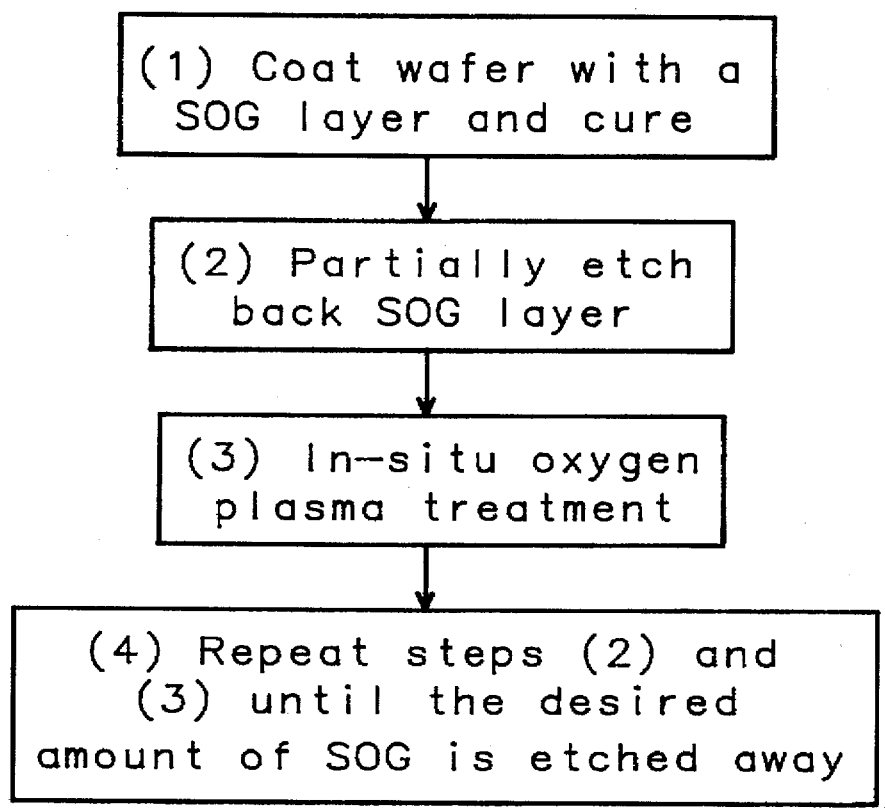
FIG. 4 is a flow chart of the steps in the process of the present invention.

The overall process description begins by providing a semiconductor substrate 10 as shown in FIG. 3, which can have semiconductor devices formed within and on its surface. The devices can create an uneven surface topography and include devices such as source/drains, gate electrodes, and conductive lines. The substrate 10 preferably has an annular shape. An embodiment of the process of the invention is summarized in FIG. 4.

Over the substrate 10, a first insulating layer 12 can be formed. First insulating layer 12 can be formed of silicon oxide, silicon nitride, doped silicon oxide and TEOS-type (tetraethylorthosilicate) oxide and is preferably formed of silicon oxide. A first insulating layer 12 formed of silicon oxide can be formed by a plasma enhanced chemical vapor deposition (PECVD) process. The first insulating layer 12 has a thickness in the range of 1000 to 4000 Å and preferably has thickness in the range of about 2500 to 3500 Å and more preferably a thickness of about 3000 Å.

A SOG layer 14 then is formed over the first insulating layer 12. The spin-on-glass layer 14 can be composed of any common SOG material including silicate and siloxane types. For example, an acceptable SOG material is Allied Signal's SOG 314 from Allied Signal Corp., 3500 Garret Dr., Santa Clara, Calif., 95054–2827.

The spin-on-glass layer 14 can be formed by applying more than one spin-on-glass layer and is preferable formed by applying a double coating. The SOG layer 14 has a thickness in the range of about 5000 to 7000 Å and more preferably a thickness of about 6000 Å.

Next the SOG layer is cured. A conventional curing process at a temperature of about 450° C. is performed to evaporate the solvent and cross-link the oligomer to the SOG film. The curing makes the SOG layer better adhere to the underlying surface.

Second, the SOG layer 14 is partially etched (e.g., isotropic etched) and an accompanying polymer layer 18 also forms on the SOG layer surface as shown in FIG. 1. The polymer 18 can be formed during the etching back of the SOG layer with any fluorocarbon-type plasma, e.g., $CH_4$, $CHF_3$, $C_2F_6$, $C_3F_8$, etc. The polymer layer is formed thicker in the center of the substrate than in the outer periphery by the normal reaction kinetics.

The partial etchback of the SOG layer can be performed with any fluorocarbon-type plasma such as a trifluoromethane ($CHF_3$) and carbon tetrafluoride ($CF_4$) etch plasma chemistry. The etch can be performed at about the following conditions: a flow of $CH_4$ in the range of about 15 to 40 sccm and a flow of $CHF_3$ in the range of about 50 to 100 sccm and a ratio of $CH_4$: $CHF_3$ between about 3:10 to 6:10, and an argon flow rate of between about 300 to 400 sccm and a rf power in the range of about 450 to 550 W and at a pressure in the range of 300 to 600 mtorr and at a cathode temperature in the range of about −5° to 5° C. and a wafer temperature between about 25° to 70° C. during the etch process.

The etch is more preferably performed at the following conditions: a $CH_4$ flow of about 15 sccm and a flow of $CHF_3$ of about 50 sccm and an argon flow rate of about 300 sccm and at a pressure of about 300 mtorr and a cathode temperature of about 0° C. and rf power of about 500 W. The etch is can be performed in a LAM Research Co. Rainbow 4500 or 4520 series etcher.

The etch is then stopped. The SOG layer 14 is treated with the novel in situ oxygen containing plasma treatment to remove any polymer residue 18 on the SOG layer 14 surface. The plasma treatment can use several etching gasses capable of etching the polymer, such as an oxygen containing gas, such as oxygen, $N_2O$, NO, $H_2O$, or a mixed $O_2$ gas (e.g., $He/O_2$, $Ar/O_2$, $H_2O$). The plasma treatment process is preferably in situ in the same etcher. The treatment flow gases are turned on and stabilized and then the plasma power is turned on. In this way no purge is required between the etch back and the plasma treatment. An oxygen plasma treatment has about the following conditions: pressure in the range of about 250 to 350 mtorr, a rf power in the range of about 450 to 550 W, an electrode gap in the range of about 1.0 to 1.6 cm, an Argon flow in the range of about 250 to 350 sccm, and an oxygen flow in the range of about 2 to 7 sccm and for a time in the range of about 20 to 50 seconds. The preferred oxygen plasma treatment has about the following conditions: pressure of about 300 mtorr, rf power of about 500 W, an electrode gap of about 1.3 cm, an Argon flow of about 300 sccm, and an oxygen flow of about 5 sccm and for a time in the range of about 30 to 40 seconds. If an endpoint detection system is used, when the CO signal decreases to a constant level, the $O_2$ plasma treatment is complete.

The above etchback and oxygen plasma steps are repeated until the SOG layer 14 is etched back the desired amount. The etch back and oxygen treatment steps are preferably performed a total of two to five times. The process of the invention is summarized on FIG. 4.

As shown in FIG. 2, the polymer is thickest in the center area of the wafer and thinner in the periphery areas. It is theorized that the polymer forms faster at the center because the wafer temperature is lower at the center than at the edge. Also, the gas flow rate is faster at the edge because the pumping port is closer to the wafer edge. The polymer is composed of Teflon-type polymers (e.g., $(CF_2)_n(CHF)_n$). The polymer problem appears to be worse when an etch chemistry with a high ratio of $CHF_3$ to $CF_4$ is used to achieve a high selectivity of about 1.2 to 1.8 between the first insulating layer of silicon oxide and the SOG layer. A high selectivity between oxide and SOG is preferred because at the boundary between the $SiO_2$ and the SOG, a micro loading effect increases the SOG etch rate. The micro loading is caused by products released from the $SiO_2$ etch which enhance etching of the adjacent SOG layer. Thus the high selectivity of the oxide to SOG is necessary to compensate for this micro loading effect and maintain an even etch rate between the $SiO_2$ and the SOG.

The oxygen plasma treatment of the present invention removes the polymer from the SOG surface therefore providing an uniform, planar etch. The conventional SOG etch back process yielded thickness uniformities in the range from 12 to 15% which compares to the uniformities of the process of the present invention of about between 3 to 9%. Experiments show that for a two step Oxygen plasma treatment/etch back (e.g., etch - $O_2$ - etch - $O_2$ - etch) uniformity is about 9% and the uniformity increases to about 3% for a 5 step $O_2$ treatment/etch back (e.g., etch - $O_2$ - etch - $O_2$ - etch - $O_2$ - etch - $O_2$ - etch - $O_2$ - etch).

In a preferred embodiment of the present invention, a silicon oxide layer 12 having a thickness of about 2000 Å is formed on the substrate 10. The SOG layer 14 is formed over the silicon oxide layer 12 and the SOG layer has a thickness of about 6000 Å. The overall etchback of the SOG layer and the silicon oxide layer consumes about 6000 Å of the SOG layer and consumes between about 1500 to 2000 Å of the silicon oxide layer. The partial etch back/Oxygen containing plasma treatment sequence is repeated from 2 to 5 times to achieve the full SOG etch back.

Subsequently, the planarization process can be continued by adding combinations of insulating layers and SOG layers. For example, in FIG. 3, the middle layer 14 can represent a second SOG layer added over the etched back SOG layer thereby forming a thicker more planar SOG layer. Also, a second insulating layer 16 can be formed of the SOG layers. Other combinations of doped SOG layers and insulating layers are possible.

The present invention also reduces the amount of cleaning of the etching tools. The $O_2$ plasma treatment not only removes the polymer from the wafer, but also from the etch chamber so that the mean time between the chamber cleans can be increase compared to the conventional full SOG etch back process. In addition, the cleaner etch chamber reduces contamination of wafers thereby increasing device yields.

While the invention has been particularly shown and described with reference to the preferred embodiments thereof, it will be understood by those skilled in the art that various changes in form and details may be made without departing from the spirit and scope of the invention.

What is claimed is:

1. The method of uniformly etching back a spin-on-glass (SOG) layer over a substrate comprising:
    (a) forming a first SOG layer over a substrate and curing said first SOG layer;
    (b) partially etching back portions of said first SOG layer and simultaneously forming a polymer residue on said SOG layer;
    (c) stopping said etching back;
    (d) exposing said first SOG layer to an oxygen containing plasma thereby removing said polymer residue from said first SOG layer; and
    (e) repeating steps (b) to (d) at least once until said first SOG layer is etched back.

2. The method of claim 1 wherein said exposing said first SOG layer to said oxygen containing plasma includes having gasses selected from the group consisting of oxygen, $N_2O$, NO, $H_2O$, $He/O_2$, and $Ar/O_2$.

3. The method of claim 1 wherein said exposing said first SOG layer to an oxygen containing plasma is performed with a pressure in the range of about 250 to 350 mtorr, a rf power in the range of about 450 to 550 W, with an electrode gap in the range of about 1.0 to 1.6 cm, an Argon flow in the range of about 250 to 350 sccm, and an oxygen flow in the range of about 2 to 7 sccm and for a time in the range of about 20 to 50 seconds.

4. The method of claim 1 wherein said steps (b) to (d) are performed a total between two to five times.

5. The method of claim 1 wherein said etching back of said first SOG layer is performed with a fluorocarbon containing plasma.

6. The method of claim 1 wherein said etching back of said first SOG layer is performed with a flow of $CH_4$ in the range of about 15 to 40 sccm and a flow of $CHF_3$ in the range of about 50 to 100 sccm and a ratio of $CH_4$:$CHF_3$ between about 3:10 to 6:10, and an argon flow rate of between about 300 to 400 sccm and a rf power in the range of about 450 to 550 W and at a pressure in the range of 300 to 600 mtorr and a wafer temperature between about 25° to 70° C. during the etch process.

7. The method of claim 1 wherein said substrate has an annular shape and said polymer residue is thicker in the center of the substrate than in the outer periphery of the substrate.

8. The method of claim 1 wherein said first spin-on-glass layer is formed by applying more than one spin-on-glass coating.

9. The method of claim 1 wherein said first spin-on-glass layer is composed of a material selected from the group consisting of silicate and siloxane.

10. The method of claim 1 wherein the etching back of said first SOG layer is performed with a trifluoromethane ($CHF_3$) and carbon tetrafluoride ($CF_4$) etch plasma chemistry.

11. The method of claim 1 wherein said etching back of said first spin-on-glass layer is performed with a $CHF_3$ flow in the range of about 15 to 40 sccm, a $CF_4$ flow in the range of about 50 to 100 sccm, a pressure in the range of about 300 to 600 mTorr, and a rf power of in the range of 450 to 550 Watts.

12. The method of claim 1 wherein a first silicon oxide layer is formed over said substrate and said first SOG layer is formed over said first silicon oxide layer.

13. The method of claim 1 wherein a first silicon oxide layer is formed over said substrate, and said first SOG layer is formed over said first silicon oxide layer; said first silicon oxide layer is formed by a plasma enhanced chemical vapor deposition process with a thickness in the range of about 1000 to 4000 Å.

14. The method of claim 1 wherein a first silicon oxide layer is formed on said substrate and said first SOG layer is formed on said silicon oxide layer; said first SOG layer having a thickness in the range of about 5000 to 7000 Å; and the method further includes a final etching back said first SOG layer and said first silicon oxide layer where the final etching back consumes said first SOG layer and consumes between about 1500 to 2000 Å of said first silicon oxide layer.

15. The method of claim 13 which further includes after step (e), forming a second SOG layer over the substrate surface and forming a second silicon oxide layer over said second SOG layer.

16. The method of uniformly etching back a spin-on-glass (SOG) layer over a substrate comprising:
    (1) forming a first silicon oxide layer over the substrate surface;
    (2) forming a first SOG layer over said first silicon oxide layer; and curing and baking said first SOG layer;
    (3) etching back portions of said first SOG layer and simultaneously forming a polymer residue on said SOG layer using a fluorocarbon containing plasma;
    (4) stopping the etching back;
    (5) exposing said first SOG layer to a plasma having gasses selected from the group consisting of oxygen, $N_2O$, NO, $H_2O$, $He/O_2$, and $Ar/O_2$, thereby removing said polymer residue from said first SOG layer;
    (6) repeating steps (3) to (5) from between two and five times.

17. The method of claim 16 wherein said exposing said first SOG layer to an oxygen containing plasma is performed with a pressure in the range of about 250 to 350 mtorr, a rf power in the range of about 450 to 550 W, an electrode gap in the range of about 1.0 to 1.6 cm, an argon flow in the range of about 250 to 350 sccm, and an oxygen flow in the range of about 2 to 7 sccm and for a time in the range of about 20 to 50 seconds.

18. The method of claim 16 wherein said etching back of said first SOG layer is performed with a flow of $CH_4$ in the range of about 15 to 40 sccm and a flow of $CHF_3$ in the range of about 50 to 100 sccm, and a ratio of $CH_4$:$CHF_3$ between about 3:10 to 6:10, and an argon flow rate of between about 300 to 400 sccm, and a rf power in the range of about 450 to 550 W, and at a pressure in the range of 300 to 600 mtorr, and at a wafer temperature between about 25° to 70° C. during the etch process.

19. The method of claim 16 wherein said substrate has an annular shape and said polymer residue is thicker in the center of the substrate than in the outer periphery of the substrate.

20. The method of claim 16 wherein said first spin-on-glass layer is formed by applying more than one spin-on-glass coating.

21. The method of claim 16 wherein said first spin-on-glass layer is composed of a material selected from the group consisting of silicate and siloxane.

22. The method of claim 16 wherein the etching back of said first SOG layer is performed with a trifluoromethane ($CHF_3$) and carbon tetrafluoride ($CF_4$) etch plasma chemistry.

23. The method of claim 16 wherein said etching back of said first spin-on-glass layer is performed with a $CHF_3$ flow in the range of about 15 to 40 sccm, a $CF_4$ flow in the range of about 50 to 100 sccm, a pressure in the range of about 300 to 600 mTorr, and a rf power of in the range of 450 to 550 Watts.

24. The method of claim 16 wherein forming said first silicon oxide layer using a plasma enhanced chemical vapor deposition process; said first silicon oxide layer having a thickness in the range of about 1000 to 4000 Å.

25. The method of claim 16 wherein forming said first SOG layer with a thickness in the range of about 5000 to 7000 Å, and the overall etching back of said first SOG layer and said first silicon oxide layer consumes said first SOG layer and consumes between about 1500 to 2000 Å of said first silicon oxide layer.

26. The method of uniformly etching back a spin-on-glass (SOG) layer over a substrate comprising:

(1) forming a first silicon oxide layer over the substrate surface;

(2) forming a first SOG layer over said first silicon oxide layer; and curing and baking said first SOG layer; said first spin-on-glass layer is composed of a material selected from the group consisting of silicate and siloxane; said first SOG layer with a thickness in the range of about 5000 to 7000 Å;

(3) etching back portions of said first SOG layer and simultaneously forming a polymer residue on said SOG layer using a fluorocarbon containing plasma comprising trifluoromethane ($CHF_3$) and carbon tetrafluoride ($CF_4$); said substrate has an annular shape and said polymer residue is thicker in the center of the substrate than in the outer periphery of the substrate;

(4) stopping the etch back;

(5) exposing said first SOG layer to an oxygen containing plasma removing said polymer residue from said first SOG layer; said oxygen containing plasma comprising a pressure in the range of about 250 to 350 mtorr, a rf power in the range of about 450 to 550 W, an electrode gap in the range of about 1.0 to 1.6 cm, an argon flow in the range of about 250 to 350 sccm, and an oxygen flow in the range of about 2 to 7 sccm and for a time in the range of about 20 to 50 seconds;

(6) etching back etching back portions of said first SOG layer;

(7) repeating steps (4) to (6) from between zero and five times, until the etch back consumes said first SOG layer and consumes between about 1500 to 2000 Å of said first silicon oxide layer.

* * * * *